(12) United States Patent
Drummond

(10) Patent No.: US 11,608,932 B2
(45) Date of Patent: Mar. 21, 2023

(54) WATER-METER EXTENSION POLE

(71) Applicant: Thomas A Drummond, Wappingers Falls, NY (US)

(72) Inventor: Thomas A Drummond, Wappingers Falls, NY (US)

(*) Notice: Subject to any disclaimer, the term of this patent is extended or adjusted under 35 U.S.C. 154(b) by 91 days.

(21) Appl. No.: 17/357,781

(22) Filed: Jun. 24, 2021

(65) Prior Publication Data
US 2021/0404595 A1 Dec. 30, 2021

Related U.S. Application Data

(60) Provisional application No. 63/043,663, filed on Jun. 24, 2020.

(51) Int. Cl.
| | |
|---|---|
| *F16M 11/06* | (2006.01) |
| *F16M 13/02* | (2006.01) |
| *H04W 84/18* | (2009.01) |
| *F16M 11/26* | (2006.01) |
| *G01R 22/06* | (2006.01) |
| *B25G 1/04* | (2006.01) |

(52) U.S. Cl.
CPC .............. *F16M 11/06* (2013.01); *F16M 11/26* (2013.01); *F16M 13/02* (2013.01); *G01R 22/065* (2013.01); *H04W 84/18* (2013.01); *B25G 1/04* (2013.01)

(58) Field of Classification Search
USPC ........ 348/376; 396/419, 420, 422, 423, 427, 396/428; 248/682, 158, 161, 125.1, 511, 248/529, 533, 534, 539, 351, 354.1; 81/489, 491, 487
See application file for complete search history.

(56) References Cited

U.S. PATENT DOCUMENTS

| | | | | |
|---|---|---|---|---|
| 4,474,439 A | * | 10/1984 | Brown | F16M 11/10 396/428 |
| 4,496,228 A | * | 1/1985 | Schmidt | F16M 13/00 248/176.1 |
| 8,915,660 B1 | * | 12/2014 | Ben Yehuda | F16M 11/38 396/428 |
| 9,170,473 B1 | * | 10/2015 | Li | G03B 17/563 |
| 9,341,473 B2 | | 5/2016 | Zogg et al. | |
| 9,835,935 B1 | * | 12/2017 | Wilgosz | F16M 11/041 |

(Continued)

FOREIGN PATENT DOCUMENTS

WO WO2018000122 A1 1/2018

*Primary Examiner* — Alfred J Wujciak

(57) ABSTRACT

A water-meter extension pole is an apparatus that positions a smart device beside a water meter in order to safely and accurately capture a water meter reading. The apparatus includes a length-adjustable pole, a first holder, a second holder, and a handle. The length-adjustable pole upholds and positions the first holder and the second holder a desired distance from the handle. The first holder is preferably a spring-loaded clamp that secures a water-meter. The second holder secures a smart device, preferably with a camera, beside the first holder. The handle provides a grip for a user with the length-adjustable pole. The smart device is remotely operated as the apparatus further includes a controller housing, a microcontroller, a wireless communication device, a power source, a power button, and a controller button. The controller housing contains the microcontroller, the wireless communication device, and the power source, preferably beside the handle.

15 Claims, 5 Drawing Sheets

(56) References Cited

U.S. PATENT DOCUMENTS

| | | |
|---|---|---|
| 10,113,871 B2 | 10/2018 | Ang et al. |
| D852,872 S * | 7/2019 | Fang .......................... D16/244 |
| 2008/0180319 A1 | 7/2008 | Islam et al. |
| 2010/0278523 A1* | 11/2010 | Brown .................... G03B 17/00 |
| | | 396/421 |
| 2011/0253653 A1* | 10/2011 | Chang .................... A61B 90/50 |
| | | 211/70.6 |
| 2012/0001768 A1 | 1/2012 | Radosavljevic et al. |
| 2016/0256996 A1* | 9/2016 | Sun ..................... F21V 33/0084 |
| 2017/0192341 A1* | 7/2017 | Casarez ................. F16M 11/16 |
| 2018/0024421 A1* | 1/2018 | Scott .................... G03B 17/561 |
| | | 396/420 |
| 2018/0115716 A1* | 4/2018 | Gubler ................... B64D 47/08 |
| 2019/0001494 A1* | 1/2019 | Niemeyer ............. F16M 11/18 |
| 2019/0162359 A1* | 5/2019 | Kundu ................... F16M 13/04 |
| 2020/0001321 A1* | 1/2020 | Carey ...................... B05B 9/01 |

* cited by examiner

WATER-METER EXTENSION POLE

The current application claims a priority to the U.S. Provisional Patent application Ser. No. 63/043,663 filed on Jun. 24, 2020.

FIELD OF THE INVENTION

The present invention generally relates to water meter accessories. More specifically, the present invention is a water-meter extension pole.

BACKGROUND OF THE INVENTION

Water damage is a common issue seen in many building structures that must be tended to both quickly and properly. The water mitigation industry requires accurate readings and accountability in order to fix the water damage and ensure that the water damage does not occur again. An essential aspect of the water mitigation business is to take pictures of a water meter that is positioned at typically high points along a wall or ceiling. Although an individual may use a ladder or step stool, there are many instances where the water damage is simply out of reach. If the water damage is too far for a water meter to be effectively positioned near the water damage, it is certainly difficult for an individual to view the readings of the water meter and capture the readings from a display screen of the water meter. During the drying process, after water damage, approximately 15 to 20 pictures are captured daily of the water meter for the readings.

It is therefore an objective of the present invention to position a water meter adjacent water damage regardless of the position of a user with the water damage. Furthermore, the present invention is able to capture an image of the water meter while positioned a distance from the user. The present invention further accommodates a user as a water meter may be rotated and tilted according to the position of the water damage with respect to the user. The present invention allows a user to control a smart device with a camera remotely in order to capture the readings of the water meter from a distance.

DETAILED DESCRIPTIONS OF THE INVENTION

Figure 1:
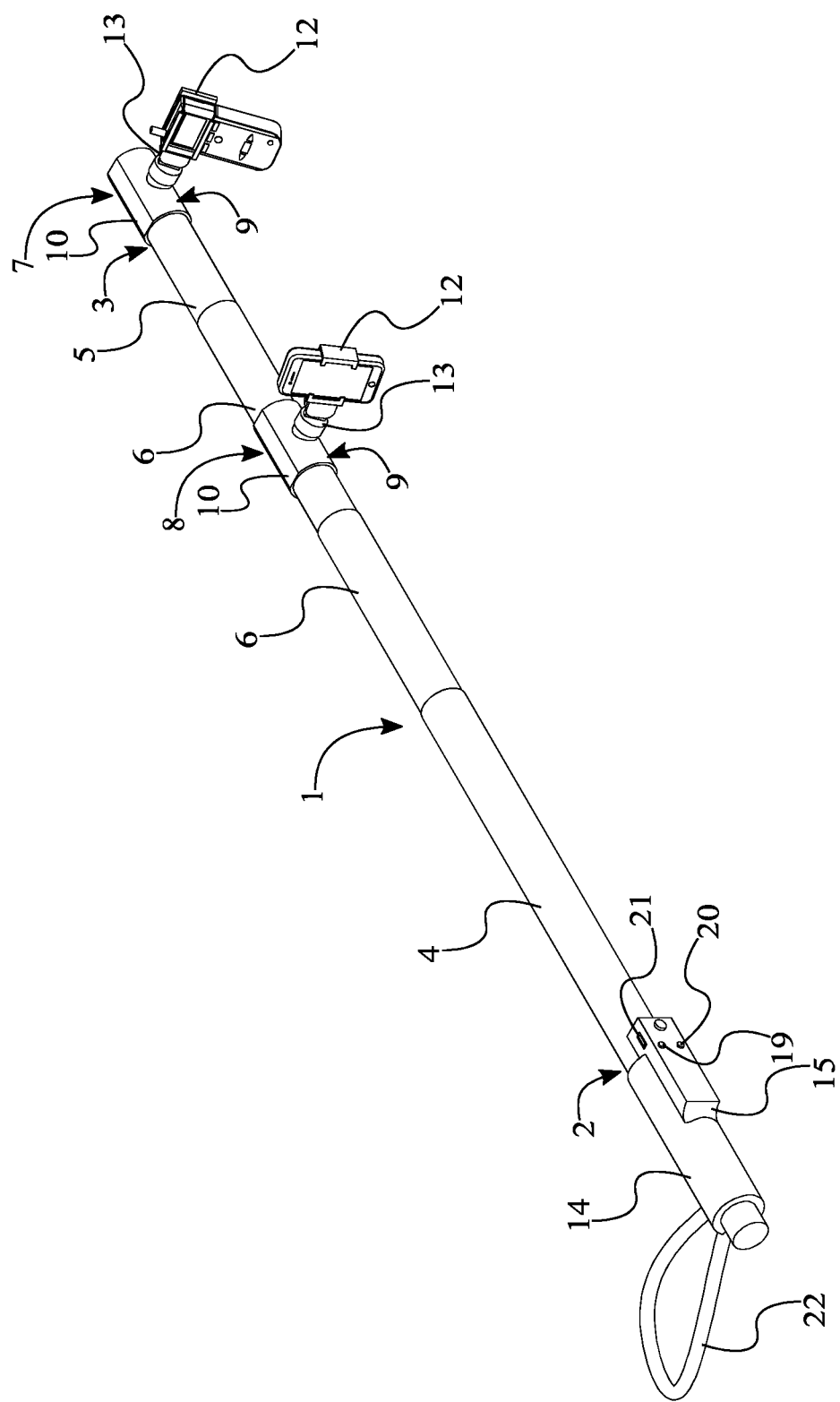
FIG. 1 is a front perspective view of the present invention.

All illustrations of the drawings are for the purpose of describing selected versions of the present invention and are not intended to limit the scope of the present invention.

The present invention is a water-meter extension pole. The present invention serves as a universal water meter extension pole that allows a photograph of the display screen of a water meter to be captured with a camera of a smart device such as a smart phone. The present invention allows a user to safely and accurately capture a photograph of the readings of the water meter without having to be physically positioned within arms-reach of the water meter. In order for the present invention to position both a water meter and a smart device an extended distance from the arms-reach of the user, the present invention may comprise a length-adjustable pole 1, a first holder 7, a second holder 8, and a handle 14, seen in FIG. 1, FIG. 2, and FIG. 3. The length-adjustable pole 1 upholds and positions a water meter and a smart device beside each other and at a position that is out of reach for the user. The water meter and the smart device are offset from the user as the length-adjustable pole 1 comprises a proximal pole end 2 a distal pole end 3. The proximal pole end 2 is positioned adjacent with the grip of the user, and the distal pole end 3 is positioned adjacent with the water meter and the smart device. The first holder 7 secures the water meter with the length-adjustable pole 1, and the second holder 8 secures the smart device with the length-adjustable pole 1. The water meter and the smart device may be oriented and positioned with each other and the length-adjustable pole 1 as needed as the first holder 7 and the second holder 8 each comprise a pole clamp 9, a device clamp 12, and a swivel joint 13. The pole clamp 9 connects the first holder 7 and the second holder 8, respectively, with the length-adjustable pole 1. The device clamp 12 secures the water meter and the smart device, respectively, and is preferably a spring-loaded clamp. The swivel joint 13 pivots the device clamp 12 is needed.

Figure 4:
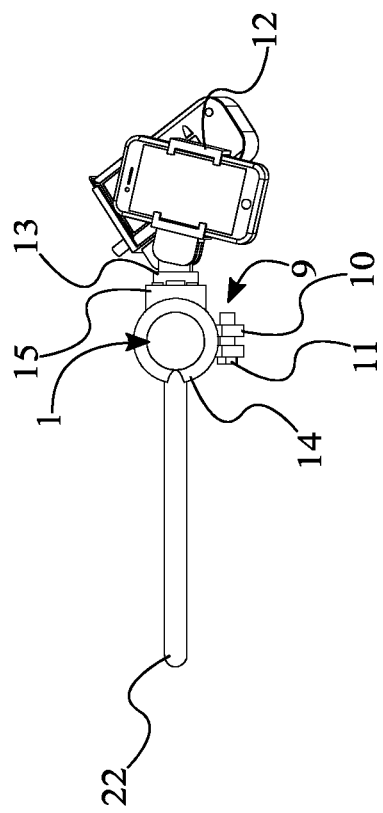
FIG. 4 is a bottom side view of the present invention.

The overall arrangement of the aforementioned components safely positions a smart device beside a water-meter without a user having to directly hold and manage the smart device. In order for the user to maneuver the first holder 7 and the second holder 8 near a position out of reach by the user, the pole clamp 9 of the first holder 7 and the pole clamp 9 of the second holder 8 are laterally attached around the length-adjustable pole 1, seen in FIG. 4. The position out of reach is typically along a structure that has or is possibly experiencing water damage. In order for the water meter to be positioned directly near the position out of reach, the first holder 7 being positioned adjacent with the distal pole end 3. The smart device is able to capture a photograph of the water meter reading seen on a display screen of the water meter as the second holder 8 is positioned offset from the first holder 7. The handle 14 is fixed adjacent with the proximal pole end 2 so that a user may easily maneuver the first holder 7, and consequently the second holder 8 with the length-adjustable pole 1. More specifically, the handle 14 is positioned colinear with the length-adjustable pole 1. This arrangement allows the length-adjustable pole 1 to serve as an extension of the arm of the user. In order for the first holder 7 and the second holder 8 to remain connected with the length-adjustable pole 1 throughout use, the pole clamp 9 is terminally mounted with the swivel joint 13, and the device clamp 12 is terminally mounted with the swivel joint 13, opposite the pole clamp 9. The water meter accurately provides a water meter reading, and the smart device accurately and clearly captures a photograph of the water meter reading with the camera of the smart device as the device clamp 12 is rotatably mounted with the swivel joint 13. The user is able to orient the first holder 7 and the second holder 8 before positioning the water meter beside the position out of reach.

As the length-adjustable pole 1 may vary in length and the surroundings of the position out of reach by the user may vary, the first holder 7 and the second holder 8 may also be repositioned and effectively secured along the length-adjustable pole 1. In order to secure a desired position of the first holder 7 and the second holder 8, the pole clamp 9 may comprise an annular clamp body 10 and a locking screw 11, seen in FIG. 3 and FIG. 4. The annular clamp body 10 surrounds the length-adjustable pole 1, and the locking screw 11 fastens the annular clamp around the length-adjustable pole 1. The length-adjustable pole 1 is positioned through the annular clamp body 10, thereby wrapping the annular clamp body 10 around the length-adjustable pole 1. A desired position for the first holder 7 and the second holder 8 is achieved as the annular clamp body 10 is slidably mounted along the length-adjustable pole 1. The locking screw 11 is laterally positioned to the annular clamp body 10 and is threadably engaged through the annular clamp body 10. This allows a user to operate and adjust the first holder 7 and the second holder 8 with the length-adjustable pole 1. The length-adjustable pole 1 is pressed against the annular clamp body 10 by the locking screw 11, thereby tightening and fixing the desired position of the first holder 7 and the second holder 8 along the length-adjustable pole 1.

A smart device is remotely operated by a user while secured within the second holder 8 as the present invention may further comprise a controller housing 15, a microcontroller 16, a wireless communication device 17, a power source 18, a power button 19, and a controller button 20, seen in FIG. 1, FIG. 2, FIG. 4, and FIG. 5. The controller housing 15 contains and conceals the microcontroller 16, the wireless communication device 17, and the power source 18. The microcontroller 16 process and manages the inputs from the power button 19 and the controller button 20. The wireless communication device 17 allows the smart device to be operated with the power button 19 and the controller button 20 without the user having to directly operate the smart device. The wireless communication device 17 is preferably a personal area network (PAN) communication device. The power source 18 supplies the microcontroller 16 and the wireless communication device 17 with the necessary power in order to function. The power source 18 is preferably rechargeable battery but may also be a replaceable battery. In order for the power button 19 and the controller button 20 to be readily available and within reach of the user, the controller housing 15 is laterally fixed onto the handle 14. The microcontroller 16, the wireless communication device 17, and the power source 18 remain connected with the length-adjustable pole 1 throughout use of the present invention as the microcontroller 16, the wireless communication device 17, and the power source 18 is mounted within the controller housing 15. The power button 19 and the controller button 20 are integrated into the controller housing 15, thereby providing direct access for the user. In order for the smart device to be remotely engaged by the present invention, the wireless communication device 17, the power button 19, and the controller button 20 are electronically connected with the microcontroller 16. The microcontroller 16 and the wireless communication device 17 are electrically connected with the power source 18, allowing the microcontroller 16 and the wireless communication device 17 to function.

Figure 2:
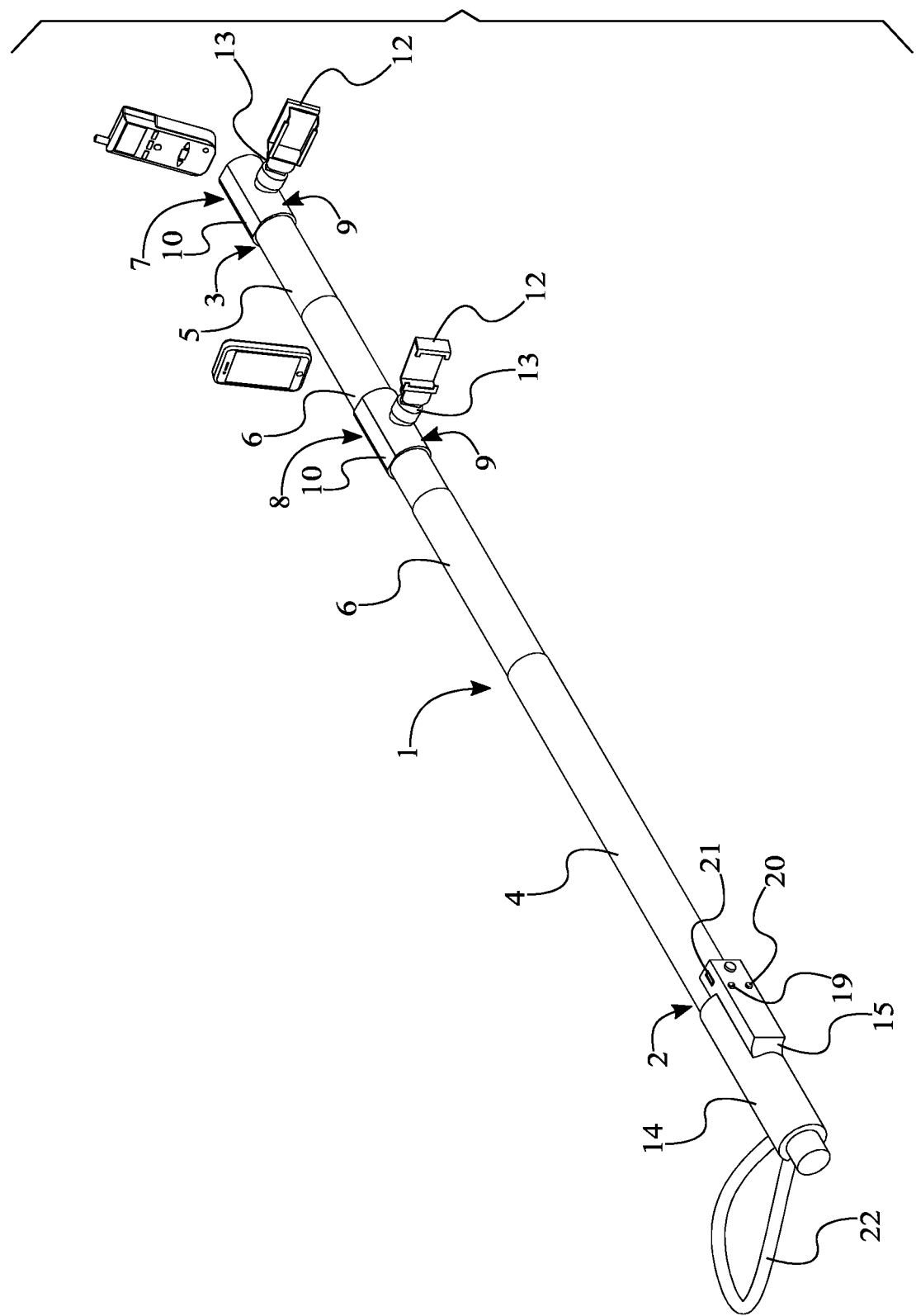
FIG. 2 is a front perspective view of the present invention with a water meter and a smart phone removed from a first holder and a second holder.
Figure 5:
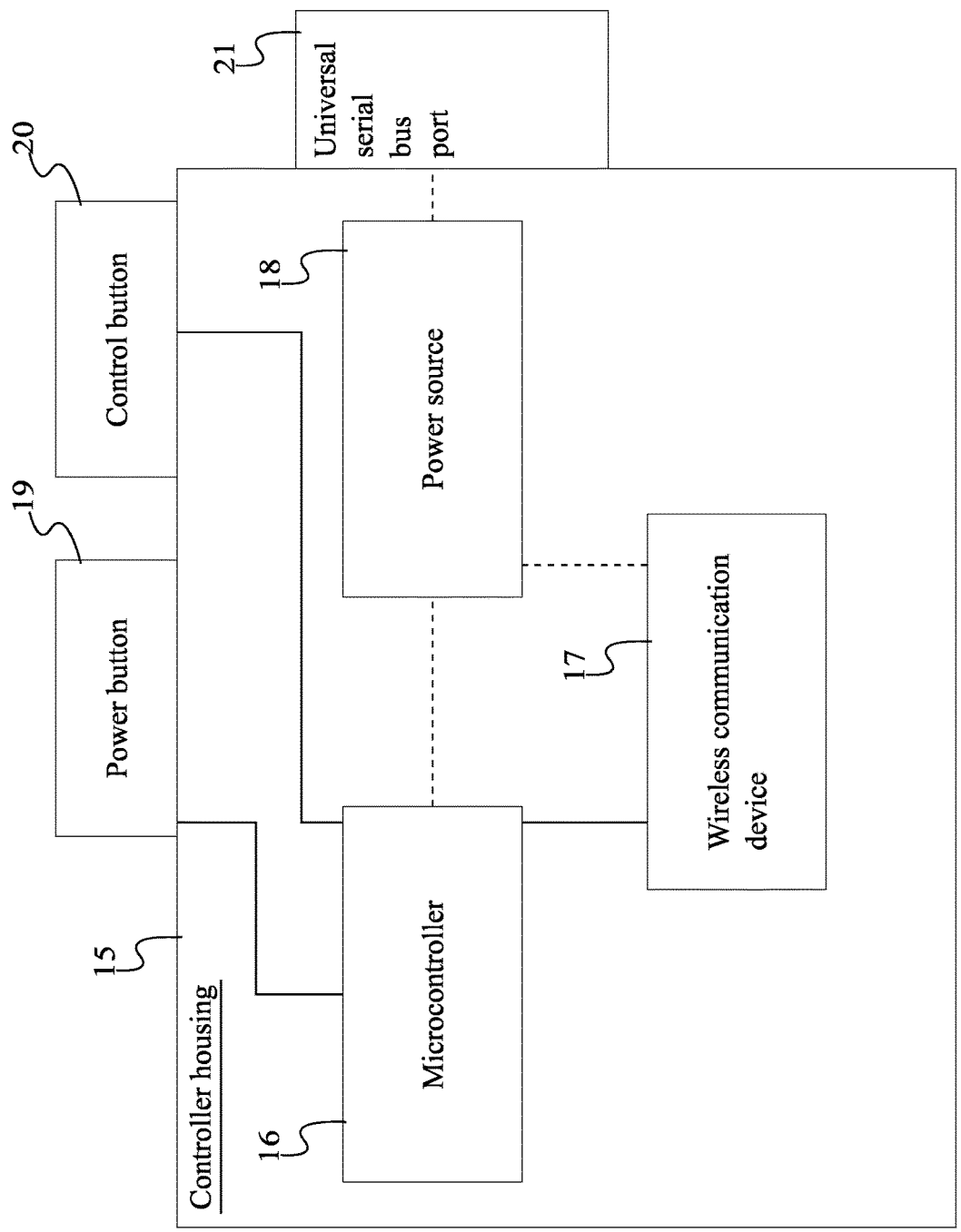
FIG. 5 is a schematic view of the electronic connections of the present invention.

In order to recharge the power source 18, the present invention may further comprise a universal serial bus (USB) port 21, seen in FIG. 1, FIG. 2, and FIG. 5. The USB port 21 readily receives the USB connector of a charging cable that is connected to an external power source 18 such as a battery or a wall outlet. The USB port 21 is integrated into the controller housing 15, providing a direct connection between the USB connector and the power source 18. The power source 18 harnesses power from the external power source 18 through the USB connector as the USB port 21 is electrically connected with the power source 18.

Figure 3:
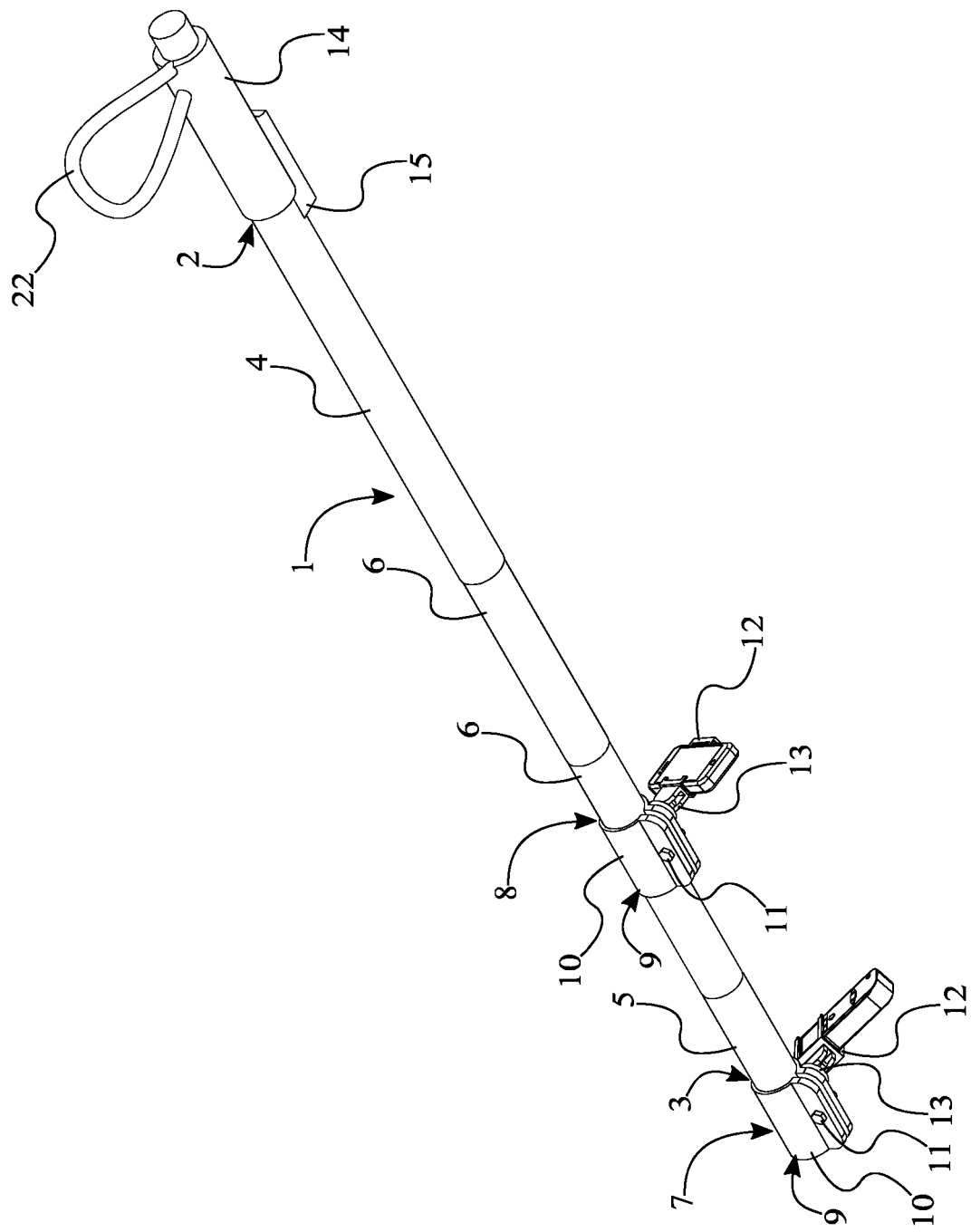
FIG. 3 is a rear perspective view of the present invention.

In the preferred embodiment of the present invention, the length-adjustable pole 1 varies in overall length as the length-adjustable pole 1 further comprises a proximal tube 4, a distal tube 5, and at least one intermediate tube 6, seen in FIG. 1, FIG. 2, and FIG. 3. The proximal tube 4 connects the length-adjustable pole 1 with the handle 14. The at least one intermediate tube 6 connects the distal tube 5 with the proximal tube 4. The proximal tube 4 is positioned coincident with the proximal pole end 2 as the proximal pole end 2 is positioned adjacent with the handle 14. Moreover, the distal tube 5 is positioned coincident with the distal pole end 3. The length-adjustable tube may be extended and retracted as the proximal tube 4 is telescopically engaged into the at least one intermediate tube 6. Likewise, the distal tube 5 is telescopically engaged into the at least one intermediate tube 6, opposite the proximal tube 4. It is understood that the proximal tube 4, the distal tube 5, and the at least one intermediate tube 6 frictionally engage with each other in order to define a desired overall length for the length-adjustable pole 1.

However, alternate embodiments may comprise mechanism that automatically extends and retracts the length-adjustable pole 1 with another control button.

The safety of the present invention is further enhanced as the present invention may further comprise a lanyard 22, seen in FIG. 1, FIG. 2, FIG. 3, and FIG. 4. A user may wrap the lanyard 22 around his or her grip or wrist in order to better secure the connection between the present invention and the user. In order for the lanyard 22 to be easily engaged by the user, the lanyard 22 is positioned adjacent with the handle 14, opposite the length-adjustable pole 1. Moreover, the user has direct access to the lanyard 22 as the lanyard 22 is laterally connected with the handle 14.

Although the invention has been explained in relation to its preferred embodiment, it is to be understood that many other possible modifications and variations can be made without departing from the spirit and scope of the invention as hereinafter claimed.

What is claimed is:
1. A water-meter extension pole comprises:
a length-adjustable pole;
a first holder;
a second holder;
a handle;
the length-adjustable pole comprises a proximal pole end and a distal pole end;
the first holder and the second holder each comprise a pole clamp, a device clamp, and a swivel joint;
the swivel joint comprises a proximal joint end and a distal joint end;
the pole clamp of the first holder and the pole clamp of the second holder being laterally attached around the length-adjustable pole;
the first holder being positioned adjacent with the distal pole end;
the second holder being positioned offset from the first holder;
the handle being fixed adjacent with the proximal pole end;
the handle being positioned colinear with the length-adjustable pole;
the pole clamp of the first holder being torsionally mounted to the proximal joint end of the swivel joint of the first holder;
the device clamp of the first holder being rotatably mounted to the distal joint end of the swivel joint of the first holder;

the pole clamp of the second holder being torsionally mounted to the proximal joint end of the swivel joint of the second holder; and, the device clamp of the second holder being rotatably mounted to the distal joint end of the swivel joint of the second holder.

2. The water-meter extension pole as claimed in claim 1 comprises:

the pole clamp comprising an annular clamp body and a locking screw;

the length-adjustable pole being positioned through the annular clamp body;

the annular clamp body being slidably mounted along the length-adjustable pole;

the locking screw being laterally positioned to the annular clamp body;

the locking screw being threadably engaged through the annular clamp body; and, the length-adjustable pole being pressed against the annular clamp body by the locking screw.

3. The water-meter extension pole as claimed in claim 1, wherein the device clamp is a spring-loaded clamp.

4. The water-meter extension pole as claimed in claim 1 comprises:

a controller housing;
a microcontroller;
a wireless communication device;
a power source;
a power button;
a controller button;

the controller housing being laterally fixed onto the handle;

the microcontroller, the wireless communication device, and the power source being mounted within the controller housing;

the power button and the controller button being integrated into the controller housing;

the wireless communication device, the power button, and the controller button being electronically connected with the microcontroller; and, the microcontroller and the wireless communication device being electrically connected with the power source.

5. The water-meter extension pole as claimed in claim 4 comprises:

a universal serial bus (USB) port;
the USB port being integrated into the controller housing; and,
the USB port being electrically connected with the power source.

6. The water-meter extension pole as claimed in claim 4, wherein the wireless communication device is a personal area network (PAN) communication device.

7. The water-meter extension pole as claimed in claim 1 comprises:

the length-adjustable pole further comprises a proximal tube, a distal tube, and at least one intermediate tube;

the proximal tube being positioned coincident with the proximal pole end;

the distal tube being positioned coincident with the distal pole end;

the proximal tube being telescopically engaged into the at least one intermediate tube; and, the distal tube being telescopically engaged into the at least one intermediate tube, opposite the proximal tube.

8. The water-meter extension pole as claimed in claim 1 comprises:

a lanyard;

the lanyard being positioned adjacent with the handle, opposite the length-adjustable pole; and, the lanyard being laterally connected with the handle.

9. A water-meter extension pole comprises:

a length-adjustable pole;
a first holder;
a second holder;
a handle;
a controller housing;
a microcontroller;
a wireless communication device;
a power source;
a power button;
a controller button;

the length-adjustable pole comprises a proximal pole end and a distal pole end;

the first holder and the second holder each comprise a pole clamp, a device clamp, and a swivel joint;

the swivel joint comprises a proximal joint end and a distal joint end;

the pole clamp of the first holder and the pole clamp of the second holder being laterally attached around the length-adjustable pole;

the first holder being positioned adjacent with the distal pole end;

the second holder being positioned offset from the first holder;

the handle being fixed adjacent with the proximal pole end;

the handle being positioned colinear with the length-adjustable pole;

the pole clamp of the first holder being torsionally mounted to the proximal joint end of the swivel joint of the first holder;

the device clamp of the first holder being rotatably mounted to the distal joint end of the swivel joint of the first holder;

the pole clamp of the second holder being torsionally mounted to the proximal joint end of the swivel joint of the second holder;

the device clamp of the second holder being rotatably mounted to the distal joint end of the swivel joint of the second holder;

the controller housing being laterally fixed onto the handle;

the microcontroller, the wireless communication device, and the power source being mounted within the controller housing;

the power button and the controller button being integrated into the controller housing;

the wireless communication device, the power button, and the controller button being electronically connected with the microcontroller; and, the microcontroller and the wireless communication device being electrically connected with the power source.

10. The water-meter extension pole as claimed in claim 9 comprises:

the pole clamp comprising an annular clamp body and a locking screw;

the length-adjustable pole being positioned through the annular clamp body;

the annular clamp body being slidably mounted along the length-adjustable pole;

the locking screw being laterally positioned to the annular clamp body;

the locking screw being threadably engaged through the annular clamp body; and, the length-adjustable pole being pressed against the annular clamp body by the locking screw.

11. The water-meter extension pole as claimed in claim 9, wherein the device clamp is a spring-loaded clamp.

12. The water-meter extension pole as claimed in claim 9 comprises:

a universal serial bus (USB) port;

the USB port being integrated into the controller housing; and, the USB port being electrically connected with the power source.

13. The water-meter extension pole as claimed in claim 9, wherein the wireless communication device is a personal area network (PAN) communication device.

14. The water-meter extension pole as claimed in claim 9 comprises:

the length-adjustable pole further comprises a proximal tube, a distal tube, and at least one intermediate tube;

the proximal tube being positioned coincident with the proximal pole end;

the distal tube being positioned coincident with the distal pole end;

the proximal tube being telescopically engaged into the at least one intermediate tube; and, the distal tube being telescopically engaged into the at least one intermediate tube, opposite the proximal tube.

15. The water-meter extension pole as claimed in claim 9 comprises:

a lanyard;

the lanyard being positioned adjacent with the handle, opposite the length-adjustable pole; and, the lanyard being laterally connected with the handle.

\* \* \* \* \*